(12) United States Patent
Nakanishi et al.

(10) Patent No.: US 7,455,824 B2
(45) Date of Patent: Nov. 25, 2008

(54) AMORPHOUS CARBON, AMORPHOUS-CARBON COATED MEMBER, AND PROCESS FOR FORMING AMORPHOUS CARBON FILM

(75) Inventors: Kazuyuki Nakanishi, Seto (JP); Tadashi Oshima, Aichi-gun (JP); Hideo Hasegawa, Nagoya (JP); Hiroyuki Mori, Nisshin (JP); Takashi Iseki, Nisshin (JP); Hideo Tachikawa, Nisshin (JP); Munehisa Matsui, Toyota (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 0 days.

(21) Appl. No.: 11/002,125

(22) Filed: Dec. 3, 2004

(65) Prior Publication Data

US 2005/0142361 A1     Jun. 30, 2005

(30) Foreign Application Priority Data

Dec. 4, 2003  (JP)  ............................. 2003-406306
Nov. 25, 2004 (JP)  ............................. 2004-340860

(51) Int. Cl.
   *B32B 9/00*   (2006.01)
(52) U.S. Cl. .................................. 423/445 R; 428/408
(58) Field of Classification Search ............. 423/445 R; 428/408, 446
   See application file for complete search history.

(56) References Cited

U.S. PATENT DOCUMENTS 5,198,285 A     3/1993    Arai et al.

(Continued)

FOREIGN PATENT DOCUMENTS

JP           3-240957         10/1991

(Continued)

OTHER PUBLICATIONS

U.S. Appl. No. 11/115,192, filed Apr. 27, 2005, Mori, et al.

(Continued)

*Primary Examiner*—Archene Turner
(74) *Attorney, Agent, or Firm*—Oblon, Spivak, McClelland, Maier & Neustadt, P.C.

(57) ABSTRACT

To provide a soft amorphous carbon exhibiting a low elastic modulus, an amorphous-carbon coated member provided with a coated film comprising the amorphous carbon, and a process for forming an amorphous carbon film. The amorphous carbon comprises carbon as a major component and hydrogen in an amount of from more than 30 atomic % to 60 atomic % or less, and exhibits an elastic modulus of from 40 or more to 150 GPa or less. Moreover, the amorphous-carbon coated member comprises a conductive substrate, and a coated film fixed on at least a part of a surface of the substrate and composed of the amorphous carbon. In addition, in a process for forming the amorphous-carbon coated film, an amorphous carbon film is formed on a surface of conductive substrates by a plasma CVD method. Not only a plurality of the substrates are disposed on a substrate holder, which is disposed in a film-forming furnace and is connected with a negative electrode, in such a state that they face to each other, but also a processing gas pressure and a plasma power source are operated so as to overlap negative glows of the neighboring two substrates.

12 Claims, 5 Drawing Sheets

U.S. PATENT DOCUMENTS 5,266,398 A    11/1993   Hioki et al.

FOREIGN PATENT DOCUMENTS

| JP | 6-101047 | | 4/1994 |
|----|----------|---|--------|
| JP | 2003-027214 | * | 1/2003 |
| JP | 2003-247060 | * | 9/2003 |

OTHER PUBLICATIONS

U.S. Appl. No. 11/002,125, filed Dec. 3, 2004, Nakanishi, et al.
U.S. Appl. No. 10/488,290, filed Mar. 2, 2004, Mori, et al.

* cited by examiner

AMORPHOUS CARBON, AMORPHOUS-CARBON COATED MEMBER, AND PROCESS FOR FORMING AMORPHOUS CARBON FILM

BACKGROUND OF THE INVENTION

1. Field of the Invention

The present invention relates to amorphous carbon, an amorphous-carbon coated member using the amorphous carbon, and a process for forming an amorphous carbon film.

2. Description of the Related Art

Carbon is an extremely good material in view of resource issues and environmental issues, because its deposits are substantially infinite and it is harmless. As for carbon materials, many materials having various crystalline structures, such as diamonds, diamond-like carbon, graphite, fullerenes, carbon nano-tubes, have been known depending on the bonding forms between atoms. Among them, diamond-like carbon (or amorphous carbon) having an amorphous structure is good in terms of mechanical characteristics, such as wear resistance and solid lubricating property so that it is regarded attractive as a functional material having insulative property, visible light/infrared light transmissivity, low dielectric constant and oxygen barrier property combindely. The amorphous carbon is expected to be applicable to many industrial fields.

Various compositions and processes for forming films have been studied so far on amorphous carbon in order to improve the characteristics. For example, Japanese Unexamined Patent Publication (KOKAI) No. 6-101,047 discloses an amorphous carbon film whose major component is carbon and which contains silicon in an amount of 30 atomic % or less, and a process for producing the same. The amorphous carbon film disclosed in the publication is a hard film which exhibits a high hardness, a Vickers hardness of 4,500 Hv or more, and shows good wear resistance.

Note that it is necessary to provide amorphous carbon films, which exhibit insulative property or corrosion resistance, with a certain thickness in order to improve the durability or functions as protective films. However, high-hardness amorphous carbon films, such as the amorphous carbon film disclosed in the publication, usually exhibit high elastic moduli as well. Accordingly, when the film thickness of the amorphous carbon film is thickened, the internal stress of the film heightens so that there arises a problem that the film has come off or has been damaged. Consequently, the film thickness is limited to about 3 µm at the thickest. In particular, when a hard amorphous carbon film is formed on a substrate of low elastic modulus, the film cannot follow the deformations of the substrate so that the come-off or damaged film has occurred frequently.

On the contrary, when an amorphous carbon film exhibits a low elastic modulus and is soft, even if the amorphous carbon film is formed on a substrate with such a thickness that it can retain durability, the amorphous carbon can secure adhesiveness to the substrate.

SUMMARY OF THE INVENTION

The present invention therefore aims at providing a soft amorphous carbon exhibiting a low elastic modulus, an amorphous-carbon coated member provided with a coated film comprising the amorphous carbon, and a process for forming an amorphous carbon film.

An aspect of the present invention is an amorphous carbon comprising:
    carbon as a major component; and
    hydrogen in an amount of from more than 30 atomic % to 60 atomic % or less; and
    exhibiting an elastic modulus of from 40 or more to 150 GPa or less.

The amorphous carbon according to the present invention is amorphous carbon containing many C—H bonds, an organic component, exhibits a low elastic modulus, and is soft.

The present amorphous carbon can preferably be adapted so that, when an entire content of the carbon is taken as 100 atomic %, a content of carbon having an $sp^3$ hybrid orbital falls in a range of from 10 atomic % or more to 85 atomic % or less. Moreover, the present amorphous carbon can preferably exhibit a Vickers hardness falling in a range of from 400 or more to 1,500 Hv or less. In addition, the present amorphous carbon can preferably comprise silicon in an amount of 50 atomic % or less when the entirety is taken as 100 atomic %.

Another aspect of the present invention is an amorphous-carbon coated member comprising:
    a conductive substrate; and
    a coated film fixed on at least a part of a surface of the substrate;
    the coated film composed of amorphous carbon comprising:
        carbon as a major component; and
        hydrogen in an amount of from more than 30 atomic % to 60 atomic % or less; and
        exhibiting an elastic modulus of from 40 or more to 150 GPa or less.

The coated film is so soft that, even when the present amorphous-carbon coated member deforms, the coated film is likely to follow the deformations. Accordingly, internal stresses generate in the coated film so as to make the coated film less likely to be broken.

The Vickers hardness of the coated film can preferably fall in a range of from 400 or more to 1,500 Hv or less. Thus, not only it is possible to reduce the come-off or damaged coated film, but also to inhibit mating members from being damaged when the surface with the coated film fixed is turned into a sliding surface. Further, the film thickness of the coated film can preferably be from 0.1 or more to 200 µm or less. Since the elastic modulus of the coated film is low, or since the elastic modulus and hardness thereof are low, the come-off or damaged film occurs less even when the coated film is formed thicker than it is formed usually. Furthermore, the amorphous carbon can preferably comprise silicon in an amount of 50 atomic % or less when the entirety is taken as 100 atomic %. Moreover, a content of carbon can preferably fall in a range of from 10 atomic % or more to 85 atomic % or less.

Still another aspect of the present invention is a process for forming an amorphous carbon film comprising:
    disposing a plurality of conductive substrates on a substrate holder in such a state that they face to each other, the substrate holder disposed in a film-forming chamber and connected with a negative electrode;
    operating a processing gas pressure and a plasma power source so as to overlap negative glows of the neighboring two substrates; and
    forming an amorphous carbon film on at least a part of the substrates by a plasma CVD method.

When operating the processing gas pressure and plasma power source so as to overlap negative glows of the neighboring two substrates, a low-voltage and high-current density discharge occurs at the overlapped negative glows. The low-voltage and high-current density discharge can produce soft and less defective amorphous carbon films, because shocks resulting from bombarding ions are less likely to damage films in forming films.

A plasma light-emission intensity at the overlapped negative glows can desirably be 1.5 times or more intenser than a plasma light-emission intensity at overlapping-free portions. Moreover, a sheath width can desirably fall in a range of from a quarter or more of an interval between oppositely facing surfaces of the two neighboring substrates to the interval between the oppositely facing surfaces or less. In addition, the processing gas pressure can desirably fall in a range of from 13 or more to 1,330 Pa or less; and an interval between oppositely facing surfaces of the two neighboring substrates can desirably fall in a range of from 2 or more to 60 mm or less.

It is advisable that one of the two neighboring substrates can comprise a member exhibiting conductivity and having a plurality of through holes penetrating the opposite surfaces. In this instance, in the member having a plurality of holes, the through holes can desirably have a size in which the negative glows can overlap.

Further, when controlling a hydrocarbon content of the processing gas to 60 atomic % or more, it is possible to produce an amorphous carbon film comprising hydrogen in an amount of from more than 30 atomic % to 60 atomic % or less. For example, the processing gas can desirably comprise a hydrocarbon gas, or amixture gas composed of a hydrocarbon gas and a diluent gas comprising one or more members selected from the group consisting of hydrogen and noble gases. Furthermore, the processing gas can desirably comprise a raw material gas including one or more members selected from the group consisting of hydrocarbon gases, gases containing an organic metal including silicon at least, and halide gases, or a mixture gas composed of the raw material gas and a diluent gas comprising one or more members selected from the group consisting of hydrogen and noble gases. In this instance, the gases containing an organic metal can desirably comprise tetramethylsilane or silane. Moreover, the halide gases can desirably comprise silicon tetrachloride.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Figure 1:
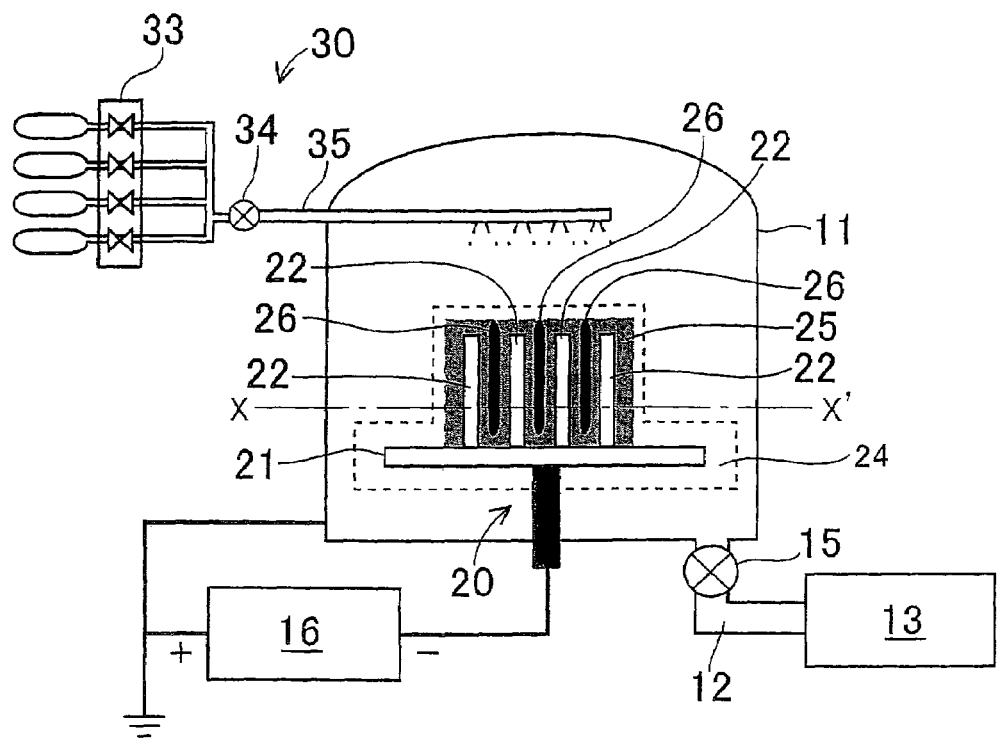
FIG. 1 is a diagram for roughly illustrating an apparatus for forming an amorphous carbon film according to an example of the present invention, and showing how substrates were disposed in Example Nos. 1 through 3, Example No. 5 and Example No. 6.

The present amorphous carbon, the present amorphous-carbon coated member, and the present process for forming an amorphous carbon film will be hereinafter described in detail with reference to embodiment modes.

Amorphous Carbon

The present amorphous carbon comprises carbon as a major component, and hydrogen in an amount of from more than 30 atomic % to 60 atomic % or less; and exhibits an elastic modulus of from 40 or more to 150 GPa or less. The present amorphous carbon comprises more hydrogen than general amorphous carbon does. Amorphous carbon with more hydrogen content exhibits a low elastic modulus and is soft, because it contains more C—H bonds, an organic component. Lesser hydrogen content impairs the flexibility of amorphous carbon, but more hydrogen content makes it difficult to synthesize amorphous carbon. A preferable hydrogen content in the present amorphous carbon can be from 35 atomic % or more to 50 atomic % or less.

Moreover, the major component, carbon, is divided into carbon (C $sp^2$) having an $sp^2$ hybrid orbital and carbon (C $sp^3$) having an $sp^3$ hybrid orbital depending the differences of atomic orbitals in chemical bonds. In the present specification, carbon making an $sp^2$ hybrid orbital to be bondable will be referred to as "carbon having an $sp^2$ hybrid orbital" or "C$sp^2$." Likewise, carbon making an $sp^3$ hybrid orbital to be bondable will be referred to as "carbon having an $sp^3$ hybrid orbital" or "C$sp^3$."

In general, graphite composed of C$sp^2$ alone, and diamond composed of C$sp^3$ alone have been known well. Graphite comprises laminated carbon six-member ring layers which are formed by the neighboring carbon atoms being covalent bonded in three directions in an identical plane by the $sp^2$ hybrid orbitals. Graphite has carbon-carbon double bonds (C═C bonds) by means of C$sp^2$ in the carbon six-member ring layers. On the other hand, diamond has a structure in which the neighboring carbon atoms are covalent bonded in four directions (directions heading from the center of a regular tetrahedron to the respective apexes thereof) by the $sp^3$ hybrid orbitals and the thus covalent bonded carbon atoms are disposed one after another three-dimensionally. Diamond has carbon-carbon bonds (C—C bonds) by means of C$sp^3$.

The present inventors devoted themselves to studying on amorphous carbon whose major component in carbon over and over again, and, as a result, they obtained knowledge that the hardness and the like of coated films formed of amorphous carbon depend on the proportions of $Csp^2$ and $Csp^3$ in the entire carbon. For example, when the proportion of $Csp^3$ increases, the coated films are hardened by means of three-dimensional networks by the $sp^3$ hybrid orbitals. Thus, the internal stresses of the coated films enlarge so that, when thickening their film thicknesses, the coated films are likely to come off or being damaged.

On the other hand, the present amorphous carbon comprises a large amount of hydrogen comparatively. Accordingly, the C—C bonds by the $sp^3$ hybrid orbitals are separated by hydrogen atoms (H), are turned into end groups, and are made into C—H bonds. As a result, the present amorphous carbon is susceptible to stresses so that it is likely to deform, and consequently exhibits a low elastic modulus. Thus, the present amorphous carbon can form coated films with smaller internal stresses, and makes it possible to thicken them. Moreover, in the C—C bonds by the $sp^3$ hybrid orbitals, all of the electrons are constrained by the covalent bonds. Accordingly, when the proportion of the $sp^3$ hybrid orbitals increases, the present amorphous carbon exhibits high insulative property. Note that it is difficult to quantitatively analyze the termination of molecules by the C—H bonds. Consequently, in the present specification, the termination of molecules by the C—H bonds is judged by the elastic modulus and hardness of amorphous carbon. For example, even when hydrogen are included in a large amount, if no termination of molecules by the C—H bonds occurs so that hydrogen atoms are present without producing the C—H bonds, the elastic modulus and hardness of amorphous carbon do not lower.

The $Csp^3$ content in the present amorphous carbon can preferably be 10 atomic % or more when the entire carbon content is taken as 100 atomic %, for example. It can more appropriately be 20 atomic % or more. Meanwhile, in view of reducing the hardness, the $Csp^3$ content can preferably be 85 atomic % or less. It can more appropriately be 50 atomic % or less. Note that it is believed that two kinds of carbon, the $Csp^2$ and $Csp^3$, constitute the present amorphous carbon. Therefore, an appropriate $Csp^2$ content in the present amorphous carbon can be from 15 atomic % or more to 90 atomic or less when the entire carbon content is taken as 100 atomic %.

As a quantitative analysis method for the $Csp^2$ and $Csp^3$, it is possible to name a Raman scattering method, a Fourier transformation infrared spectroscopy method (Ft-IR) and an X-ray electron spectroscopy method (XPS), for example. However, the $Csp^2$ and $Csp^3$ cannot be quantitatively analyzed by these methods accurately. Therefore, in the present specification, a nuclear magnetic resonance method (NMR), which exhibits the highest quantitativeness in the structural-determination of many organic materials, is employed as the quantitative analysis method for the $Csp^2$ and $Csp^3$. For the measurement of the $Csp^2$ and $Csp^3$ contents, a high-output decoupling method (HD-MAS) is used which carries out magical angle spinning exhibiting quantitative analyzablility in solid NMR. Specifically, peaks resulting from the $Csp^2$ and $Csp^3$ are identified by $^{13}C$ NMR spectra on amorphous carbon films, and the proportions of the $Csp^2$ and $Csp^3$ in the entire carbon are calculated from the area ratios of the segments enclosed by the respective peaks and the base line. Note that the C—H bonds can be measured using FT-IR.

Moreover, the Vickers hardness of the present amorphous carbon can preferably be from 400 or more to 1,500 Hv or less, further preferably from 700 or more to 1,200 or less Hv. Amorphous carbon with a larger hydrogen content exhibits a low hardness and is soft, because it contains many C—H bonds, an organic component.

In addition, the present amorphous carbon can comprise silicon in an amount of 50 atomic % or less when the entirety is taken as 100 atomic %. Amorphous carbon comprising silicon in an amount of 50 atomic % or less shows good adhesiveness when it is formed as amorphous carbon films on a surface of metallic substrates. However, amorphous carbon comprising a large amount of silicon becomes hard amorphous carbon. Accordingly, when it is desirable to improve the adhesiveness to metallic substrates without impairing the flexibility of amorphous carbon, it is advisable that the silicon content can be 30 atomic % or less. Moreover, in order to secure high adhesiveness, it is advisable that the silicon content can be 3 atomic % or more. In particular, it can appropriately be 5 atomic % or more.

Amorphous-carbon Coated Member

The present amorphous-carbon coated member comprises a conductive substrate, and a coated film fixed on at least a part of a surface of the substrate. The coated film comprises amorphous carbon comprising carbon as a major component; and hydrogen in an amount of from more than 30 atomic % to 60 atomic % or less; and exhibiting an elastic modulus of from 40 or more to 150 GPa or less. That is, the coated film comprises the present amorphous carbon of low elastic modulus and soft.

The substrate is not limited in particular as far as it comprises conductive materials exhibiting conductivity. Moreover, the shape of the substrate is not limited in particular, either. However, the composition can preferably be free from low-melting-point and highly vaporizable elements, because its temperature is increased in forming the coated film. For example, the substrate can preferably comprise iron, aluminum, copper, titanium, magnesium, or metallic materials such as alloys of these.

The coated film is fixed on at least a part of the substrate. The elastic modulus of the coated film is from 40 or more to 150 GPa or less, but can further preferably be from 60 or more to 120 GPa or less. Even when elastic deformations or thermal expansions/contractions occur in the substrate, the coated film is likely to deform so as to follow the deformations of the substrate because the elastic modulus of the coated film is low. Thus, the coated film is inhibited from being broken by the internal stresses, and from being come off from the substrate. In particular, when the substrate is soft, it is possible to effectively inhibit the breakage of the coated film and the occurrence of its coming off.

The Vickers hardness of the coated film can preferably fall in a range of from 400 or more to 1,500 Hv or less. It can further preferably fall in a range of from 700 or more to 1,200 Hv or less. Even when elastic deformations or thermal expansions/contractions occur in the substrate, the coated film exhibiting a low hardness, a Vickers hardness falling in a range of from 400 or more to 1,500 Hv or less, is likely to deform so as to follow the deformations of the substrate. Thus, the coated film is inhibited from being broken by the internal stresses, and from being come off from the substrate. Moreover, when the surface with the coated film fixed is turned into a sliding surface, it is possible to reduce damages to mating members.

As described above, the $Csp^3$ content in the coated film can preferably be 10 atomic % or more when the entire carbon content is taken as 100 atomic %. It can more appropriately be 20 atomic % or more. Meanwhile, in view of reducing the hardness, the $Csp^3$ content can preferably be 85 atomic % or less. It can more appropriately be 50 atomic % or more.

When the elastic modulus or hardness of the coated film is too high, the above-described advantages cannot be produced. Meanwhile, when the elastic modulus or hardness of the coated film is too low, it is not preferable because the characteristics, such as the strength to loads and the abrasion resistance, lower.

Moreover, when impact forces are applied to amorphous-carbon coated members, if coated films are soft, the coated films are likely to deform. The coated films deform to increase their areas for receiving shocks so that the surface pressure lowers. As a result, the maximum impact forces receiving the amorphous-carbon coated members become less so that the amorphous-carbon coated members are less likely to be broken. That is, the present amorphous-carbon coated member exhibits good impact resistance.

Moreover, the film thickness of the coated film can preferably be from 0.1 or more to 200 μm or less. In particular, the thick coated film whose film thickness is from 1 or more to 100 μm or less is good in terms of the durability as well as the functions as a protective film. In the present amorphous-carbon coated member, the breakage and coming off of the coated film occur less even when the film thickness is thick, because the coated film is soft.

In addition, the present amorphous carbon has such properties as exhibiting a volume resitivity of from $10^8$ or more to $10^{12}$ Ω·cm or less, and being stable to strong acids and strong alkalis. Thus, the present amorphous-carbon coated member exhibits insulative property and corrosion resistance. In particular, its defective area ratio can preferably be $10^{-4}$ or less. In this instance, it demonstrates good insulative property and corrosion resistance. Note that, in the present amorphous-carbon coated member, the reasons why the coated film comprising the present amorphous carbon exhibits a low defective area ratio will be described in the following section captioned [Process for Forming Amorphous Carbon Film]. When using the present amorphous-carbon coated member as an insulative coated-film member, the volume resistivity of the substrate can be $10^8$ Ω·cm or less.

Moreover, the amorphous-carbon coated film can preferably comprise silicon in an amount of 50 atomic % or less when the entirety is taken as 100 atomic %. Comprising silicon improves the adhesiveness of the coated film when it is formed on metallic substrates. However, amorphous carbon comprising a large amount of silicon becomes hard. Accordingly, when it is desirable to improve the adhesiveness to metallic substrates without impairing the flexibility of the coated film, it is advisable that the silicon content can be 30 atomic % or less. Moreover, as described above, it is advisable that the silicon content can be 3 atomic % or more, in particular, 5 atomic % or more.

The coated film of the present amorphous-carbon coated member is appropriate for various protective films because of the insulative property, corrosion resistance and impact resistance. As for specific applications of the present amorphous-carbon coated member, it is possible name insulative heat sink materials such as power devices, corrosion-resistant component parts for pumps and piping, and mechanically sliding component parts such as gears and piston rings.

Note that the present amorphous-carbon coated member can be produced by forming an amorphous-carbon coated film on a substrate by means of a film forming process described hereinafter.

Process for Forming Amorphous Carbon Film

The present process for forming an amorphous carbon film forms an amorphous carbon film on at least a part of a conductive substrate by means of a plasma CVD method. In this instance, not only a plurality of the substrates are disposed on a substrate holder, which is disposed in a film-forming furnace and is connected with a negative electrode, in such a state that they face to each other, but also operating a processing gas pressure and a plasma power source so as to overlap negative glows of the neighboring two substrates. Note that the present process for forming an amorphous carbon film is appropriate for a process for producing the present amorphous-carbon coated member.

In the plasma CVD method, a glow discharge occurs by applying an electric powder between two electrodes, a positive electrode and a negative electrode. The glow discharge is utilized to activate the processing gas introduced between the electrodes, thereby depositing a thin film on the negative-voltage side electrode (or substrates).

The substrates are not limited as far as they comprise conductive materials exhibiting conductivitiy. The volume resistivity of conductive materials can desirably be $10^6$ Ω·cm or less. Moreover, it is possible to form films on various members, because the shape of the substrates is not limited in particular.

The substrates are fixed to the substrate holder which is disposed in the film-forming furnace and is connected with the negative electrode. In this instance, the substrates are disposed in such a state that they face to each other. Moreover, the substrates are fixed to the substrate holder connected with the negative electrode so as to contact at least a certain part of the substrates with the substrate holder. Note that, as far as the substrate holder comprises conductive materials, its shape is not limited in particular. Accordingly, in addition to plate shapes on which the substrates can be disposed, it can be formed as shapes provided with a fixture which can fix at least a certain part of the substrates.

As far as the substrates are disposed in such a state that they face to each other, the disposition pattern is not limited in particular. When the substrates-are formed as a plate, a plurality of the substrates can desirably be disposed parallel in the thickness-wise direction and in a laminated manner. When the substrates are disposed parallel in the thickness-wise direction and in a laminated manner, it is possible to form a film on a large number of the substrates in a single film-forming process because the substrates can be disposed in a plurality of pieces in the film-forming furnace. Therefore, the processing cost can be reduced.

Moreover, one of the neighboring two substrates can comprise a member exhibiting conductivity and having a plurality of through holes penetrating the opposite surfaces. When a member having a plurality of through holes is used, the supply of the processing gas to the substrates becomes favorable because the processing gas passes through the through holes, and the concentration of the processing gas around the substrates becomes less inhomogeneous. As a result, it is possible to make the film thickness and composition of the amorphous carbon film uniform. Therefore, using a member having a plurality of through holes is especially effective in forming an amorphous carbon film on a surface of large-area substrates.

Similarly to the substrates, the member having a plurality of through holes is not limited as far as it comprises conductive materials exhibiting conductivitiy. Therefore, metallic nets and punching metals are desirable. Moreover, when the substrates are formed as a plate shape, even if one of the two neighboring substrates comprises a member having a plurality of through holes, a plurality of the substrates can desirably be disposed parallel in the thickness-wise direction and in a laminated manner. In this instance, it is advisable to dispose the substrates and the members having a plurality of through holes alternately. When the substrates and the members having a plurality of through holes are disposed alternately, even if a film-forming operation is carried out while the intervals between the oppositely facing surfaces of the substrates and members having a plurality of through holes are narrowed down so as to match a sheath width, the intervals between the oppositely facing surfaces of the neighboring two substrates with the member having a plurality of through holes interposed therebetween are broadened up practically. Additionally, the supply of the processing gas to the substrates becomes favorable because the processing gas passes through the through holes. As a result, it is possible to form a film uniformly. Moreover, it is advisable to dispose the member having a plurality of through holes so as to cover the entire film-forming surface of the substrates.

The film forming is carried out by operating a processing gas pressure and a plasma power source so as to overlap negative glows of the neighboring two-substrates. In general, the "sheath" herein is a plasma "case" covering the negative electrode (or substrates), and designates a weakly light-emitting area from a surface of the negative electrode to a negative glow. In the sheath, a sharp voltage drop occurs so that positive ions are accelerated toward the negative electrode to collide with the negative electrode. Electrons (or secondary electrons), which are emitted from the negative electrode by the collision, are accelerated by the voltage gradient of the sheath, and enter the negative-glow area from the sheath to ionize or excite gaseous molecules. Then, the ionization of gaseous molecules produces positive ions and electrons to maintain the discharge. The excited gaseous molecules emit light (or glow) when they move back toward ground state. The light emission is the negative glow. The sheath emits light weakly because the electrons are not accelerated fully to an energy capable of exciting gaseous molecules. That is, the "sheath width" set forth in the present specification specifies a width of a weakly light-emitting area from a surface of the negative electrode to a negative glow. Moreover, the sheath generates along an outer surface of the substrates with a predetermined width (or sheath width "S") provided from the outer surface (See FIG. 4). Note that the negative glow has been known as set forth on page 111 of "KAITEI SHINBAN HOUDEN HANDBOOK (Revised New Edition Discharge Handbook)" written by Institute of Electrical Engineers and published by Ohm Co., Ltd.

Usually, when a surface of a substrate receives a large ionic bombardment in forming film in a low-pressure gas, atoms making the formed film re-dissipate into the gas from the substrate surface. When receiving an ionic bombardment, soft parts are knocked out of the film surface in forming film (i.e., sputtering) so that hard parts remain. As a result, amorphous carbon films formed under the condition of large ionic bombardments are hard. For example, when forming an amorphous carbon film containing hydrogen, an ionic bombardment does not allow organic and soft parts comprising C—H bonds to remain, it results in a hard amorphous carbon film whose hydrogen content is less.

However, when the negative glows of the neighboring two substrates are overlapped with each other, a low-voltage and high-electric-current-density discharge occurs at the overlapped negative glows. In low-voltage and high-electric-current-density discharges, impacts to the soft parts of films are less because ionic bombardments decrease. As a result, it is believed possible to form soft films. Moreover, films are damaged less in forming film, and consequently it is possible to form less-defective fine-textured films. These films can be utilized as good protective films, because they exhibit a defective surface rate of $10^{-4}$ or less even when they have such a thickness as 0.1 μm approximately. In addition, as a result of reduced sputtering films in forming film, it is possible to form films at fast rates. Therefore, the present amorphous-carbon film forming process can form a soft and less-defective amorphous carbon film, for example, the coated film of the present amorphous-carbon coated member, at a fast rate.

Moreover, the sheath width can desirably fall in a range of from a quarter or more of an interval between oppositely facing surfaces of the neighboring two substrates to the interval between the oppositely facing surfaces or less. If such is the case, it is possible to form a favorable film, because the sheath can glow-discharge uniformly along the outer surface of the substrates, and because the neighboring negative glows overlap. On the contrary, when the sheath width is more than the interval between the oppositely facing surfaces of the neighboring two substrates, it is not desirable because no negative glow is formed between the oppositely facing surfaces of the substrates and along therewith. The structure of glow-discharge comprises, as described above, a sheath formed around a negative electrode (or substrate), and a negative glow further formed outside the sheath. Therefore, when the sheath width is the interval between the oppositely facing surfaces of the substrates or more, no negative flow is formed. When no negative glow is formed between the oppositely facing surfaces, the activation, such as the excitation, separation and dissociation of gaseous molecules, weakens to lower the film-forming rate.

Note that, the reasons are still under investigation, the sheaths tend to be distorted between the oppositely facing surfaces of the neighboring two substrates when the sheaths approach each other. When the sheaths are distorted, there arises a phenomenon that the sheath width narrows down, as a result, the negative glows disposed outside the sheaths overlap favorably.

Moreover, the sheath width can further preferably fall in a range of from a half or more of the interval between the oppositely facing surfaces of the neighboring two substrates to the interval between the oppositely facing surfaces or less. When the sheath width is a half or more of the interval between the oppositely facing surfaces of the neighboring two substrates, the neighboring sheaths approach more so that the overlapped portion of the negative glows brightens sharply. Thus, the gaseous molecules of the raw material gas are activated so that it is possible to form a more favorable film.

A plurality of the substrates can preferably be disposed so that the interval between the oppositely facing surfaces of the two neighboring substrates falls in a range of from 2 or more to 60 mm or less. When the interval is less than 2 mm, the sheaths overlaps intensely. Depending on the film-forming conditions, glow discharges might be intensified locally, or might be unstable. Moreover, when the interval exceeds 60 mm, although stable glow discharges are produced, the overlapped portion of the negative glows decreases, or the negative glows might not overlap. Accordingly, such an interval might not be appropriate depending on the film-forming conditions. The interval between the oppositely facing surfaces of the two neighboring substrates can further preferably fall in a range of from 3 or more to 40 mm or less, furthermore preferably from 5 or more to 30 mm or less. In this instance, the sheath width can preferably fall in a range of from 1 or more to 60 mm or less, further preferably from 1.5 or more to 40 mm or less, furthermore preferably from 2.5 or more to 30 mm or less. Moreover, the processing gas pressure can preferably be controlled in a range of from 13 or more to 1,330 Pa or less, further preferably from 66.5 or more to 1,064 Pa or less, furthermore preferably from 133 or more to 798 Pa or less so as to establish the sheath wide.

Note that, when one of the two neighboring substrates comprises a member having a plurality of through holes, the negative glow of the neighboring substrates and the negative glow of the member having a plurality of through holes are disposed to overlap with each other, and simultaneously the negative glows can desirably overlap inside the through holes. For example, when the through holes are formed as a circle, the sheath width can preferably be a quarter or more of the diameter of the through holes, further preferably the radius or more. That is, when the sheath width is the intervals between the surfaces of the substrate and the member having a plurality of through holes or less, and when the negative glows are disposed to overlap inside the through holes as well, a low-voltage and high-electric-current-density discharge can be produced for the substrates as a whole, because the negative glows overlap at the through-hole portions as well as at the substrate-surface portions.

A plasma light-emission intensity at the overlapped negative glows can desirably be 1.5 times or more intenser than a plasma light-emission intensity at overlapping-free portions. With such an arrangement, it is possible to upgrade the film-forming rate. When being 7 times or more, the film forming becomes much faster so that it is possible to produce thick amorphous carbon films within practical times.

Moreover, the film-forming temperature can desirably be 500° C. or less, and can more desirably fall in a range of from 200 or more to 450° C. or less. When the film-forming temperature exceeds 500° C., the film-forming rate becomes slower because such a probability heightens so that film-forming active species, which arrived at the substrates, have left again into the atmosphere. Besides, it is not desirable because impacts from ions enlarge in forming film so that the chances of damaged film increase in forming film. Moreover, when the film-forming temperature is low, it is not desirable because minute arcs occur so that it is difficult to produce stable glow discharges. Note that the film-forming temperature is a temperature in a surface of the substrates in forming film.

As the processing gas, it is advisable to use gases containing hydrogen abundantly. Specifically, when the hydrogen content of the processing gas is 60 atomic % or more, it is possible to form amorphous carbon films comprising hydrogen in an amount of from more than 30 atomic % to 60 atomic % or less.

For example, the processing gas can desirably comprise a hydrocarbon gas, or a mixture gas composed of a hydrocarbon gas and a diluent gas comprising one or more members selected from the group consisting of hydrogen and noble gases. Moreover, when it is desired to produce an amorphous carbon film comprising silicon, it is desirable to use a processing gas comprising a raw material gas including one or more members selected from the group consisting of hydrocarbon gases, gases containing an organic metal including silicon at least, and halide gases, or a mixture gas composed of the raw material gas and a diluent gas comprising one or more members selected from the group consisting of hydrogen and noble gases. The processing gas can be determined by appropriately selecting the types, mixing ratios or flow-volume ratios so that the composition of the resulting amorphous carbon film becomes a desired composition.

In this instance, the hydrocarbon gas can desirably comprise methane, ethylene, acetylene, benzene, hexane, or the other ($C_mH_n$) hydrocarbon gases. Moreover, the gases containing an organic metal can desirably comprise tetramethylsilane ($Si(CH_3)_4$: TMS) or silane. In addition, the halide gases can desirably comprise silicon tetrachloride.

Moreover, the diluent gas can desirably comprise those whose atomic weight is lighter than that of Ar, specifically, H, He and Ne. When using a diluent gas whose atomic weight is lighter than that of Ar, the chances of damaged film reduce in forming film because films receive less ionic bombardment, and accordingly it is possible to form soft and less-defective films at faster rates. Therefore, the diluent gas can desirably comprise a hydrogen gas alone, or mixture gases whose major components are hydrogen and helium.

The present amorphous carbon, amorphous-carbon coated member, and process for producing an amorphous carbon film are not limited to the above-described specific embodiment modes. It will be possible for one of ordinary skill in the art to carry out the present amorphous carbon, amorphous-carbon coated member, and process for producing an amorphous carbon film in various modes provided with such changes and modifications that he or she can think of within a range and without departing from the spirit or scope of the present invention.

EXPERIMENTAL EXAMPLES

Examples of the present amorphous carbon, amorphous-carbon coated member and process for producing an amorphous carbon film will be hereinafter described with reference to the drawings. To begin with, an apparatus for forming an amorphous carbon film will be described.

Film-forming Apparatus

Figure 5:
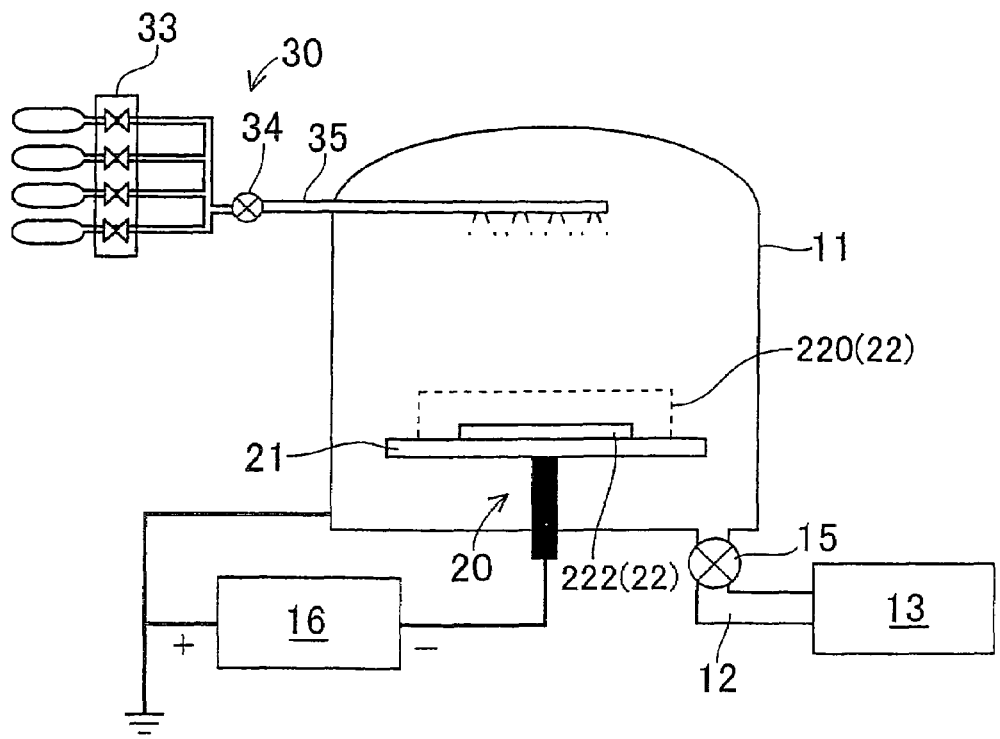
FIG. 5 is a diagram for roughly illustrating an apparatus for forming an amorphous carbon film according to another example of the present invention, and showing how a substrate was disposed in Example No. 4.

FIG. 1 and FIG. 5 are conceptual explanatory diagrams on an apparatus for forming an amorphous carbon film, respectively.

An apparatus for forming an amorphous carbon film comprises a cylinder-shaped stainless-steel chamber 11 used as a film-forming furnace, and an exhaust system 13 communicated with the chamber 11 through an exhaust passage 12. The exhaust system 13 comprises a hydraulic rotary pump, a mechanical booster pump, and a hydraulic diffusion pump. The processing pressure in the chamber 11 is controlled by opening/closing an exhaust control valve 15 disposed in the exhaust passage 12.

In the chamber 11, there are disposed a negative electrode 20 connected with the negative electrode of a plasma power source 16, and gas-supplying means 30.

The negative electrode 20 comprises a support bench 21 connected with the negative electrode of the plasma power source 16, and flat plate-shaped substrates 22 having a surface on which an amorphous carbon film is formed. The support bench 21 is made of stainless steel, is formed as a disk shape, and is fixed to the bottom of the chamber 11 coaxially with the cylinder-shaped chamber 11. Note that the flat plate-shaped substrates 22 can be held on the support bench 21 in an arbitrary disposition.

The present film-forming apparatus comprises the gas-supplying means 30. The gas-supplying means 30 supplies a mixture gas composed of a raw material gas and a diluent gas to the chamber 11 with an arbitrary flow-volume ratio. The mixture gas is supplied inside the chamber 11 through a gas-supplying pipe 35 via a gas-supplying valve 34 after the flow volume is controlled by a mass flow controller (MFC) 33. Moreover, the gas-supplying pipe 35 is provided with a plurality of holes opened at equal intervals in the lengthwise direction. The gas-supplying pipe 35 is disposed so as to be positioned at the central portion of the chamber 11 so that the mixture gas is supplied uniformly onto the flat plate-shaped substrates 22 held on the support bench 21.

The positive electrode of the plasma power source 16 is connected with the chamber 11 and the ground, and accordingly the wall surface of the chamber 11 is a ground electrode (or positive electrode).

Example No. 1

Figure 2:
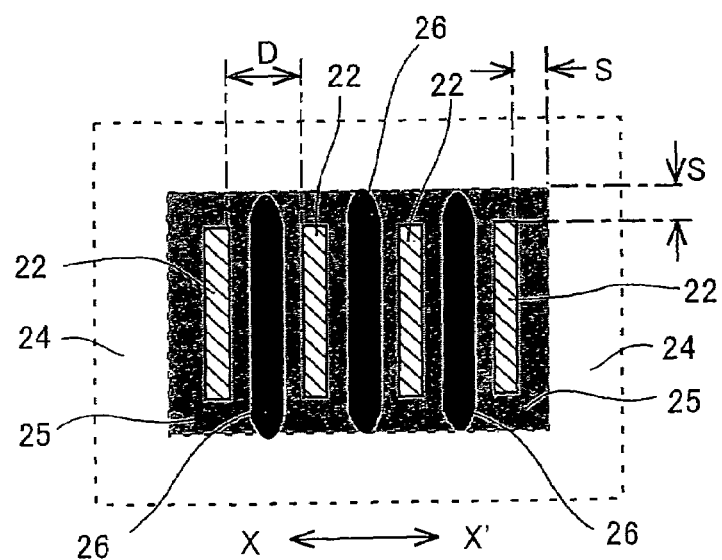
FIG. 2 is a diagram for schematically showing how a glow discharge appeared during forming films in Example Nos. 1, 2 and 5, and is a cross-sectional view taken along the alternate long and one dash line "X"-"X'" of FIG. 1.

An amorphous carbon film according to Example No. 1 will be described using FIG. 1 and FIG. 2. Note that FIG. 2 is a diagram for schematically showing how a glow discharge appeared during forming films in the present example, and is a cross-sectional view taken along the alternate long and one dash line "X"-"X'" of FIG. 1.

The film-forming apparatus with the above-described construction was operated to form an amorphous carbon film on a surface of the flat plate-shaped substrates 22. In the present example, four pieces of 22 mm×39 mm×3 mm flat plate-shaped substrates made of pure aluminum were used as the flat plate-shaped substrates 22. As illustrated in FIG. 1 and FIG. 2, these flat plate-shaped substrates 22 were disposed one after another so as to be put in a parallel manner in the thickness-wise direction and in a laminated manner. On the top surface of the support bench 21, there were formed grooves (not shown) with a depth of 1 mm so as to dispose them at equal intervals and parallel to each other. The flat plate-shaped substrates 22 were fitted into the grooves so that the flat plate-shaped substrates 22 were fixed to the support bench 21. Note that the intervals "D" between the oppositely facing surfaces of the two neighboring flat plate-shaped substrates 22 were designed to be 10 mm, respectively.

Next, the film-forming procedure will be described. First, the inside of the chamber 11 was evacuated to an ultimate vacuum of $1 \times 10^{-2}$ Pa by the exhaust system 13. Then, the gas-supplying valve 34 was opened to supply a hydrogen gas (i.e., diluent gas) into the chamber 11 while controlling the flow volume of the hydrogen gas with the MFC 33. Thereafter, the opening degree of the exhaust control valve 15 was controlled to set the processing gas pressure in the chamber 11 at 370 Pa.

Moreover, −100 V voltage was applied to the negative electrode 20 by the plasma power source 16. When applying the voltage, a glow discharge occurred around the negative electrode 20. The discharge power was controlled to −250 V and 0.2 A approximately, and accordingly the flat plate-shaped substrates 22 were heated to 300° C. by the glow discharge. Note that a radiation thermometer was used to measure the temperature of substrates. When the flat plate-shaped substrates 22 were heated to 300° C., methane and TMS, raw material gases, were supplied at a predetermined flow volume, respectively, to develop an amorphous carbon film on a surface of the flat plate-shaped substrates 22. Note that, when film forming is carried out with a hydrocarbon gas alone, the flat plate-shaped substrates 22 can be heated to a processing temperature with a diluent gas introduced therearound. Thereafter, a hydrocarbon gas can be supplied after stopping the supply of the diluent gas.

Moreover, in the present example, the flow volume of the mixture gas was set to be as follows: methane: 50 sccm (i.e., standard cc/min), TMS: 1 sccm, and hydrogen gas: 60 sccm. Note that 6-hour discharge (or a film-forming temperature of 300° C.) produced a 12 μm-film thickness amorphous carbon film on a surface of the flat plate-shaped substrates 22.

In addition, amorphous-carbon coated members provided with the amorphous carbon film produced in Example No. 1 were labeled No. 1.

Example No. 2

Except that the flat plate-shaped substrates 22 were made of stainless steel (or SUS304), an amorphous carbon film was formed on a surface of the flat plate-shaped substrates 22 in the same manner as Example No. 1. Note that 6-hour film-forming (or a film-forming temperature of 300° C.) produced a 16 μm-film thickness amorphous carbon film on a surface of the flat plate-shaped substrates 22.

In addition, amorphous-carbon coated members provided with the amorphous carbon film produced in Example No. 2 were labeled No. 2.

Here, FIG. 2 illustrates how the glow discharge appeared during film forming in Example Nos. 1 and 2. In Example Nos. 1 and 2, a sheath 25 and a negative glow 24 were formed around the negative electrode 20. On the flat plate-shaped substrates 22, there was formed the sheath 25 provided with a predetermined sheath width (or "S"=5 mm) along the flat-shaped substrates 22. Between the oppositely facing surfaces of the flat plate-shaped substrates 22, each negative glow of the oppositely facing flat plate-shaped substrates 22 overlapped to form negative-glow overlaps 26 which were brighter than negative glows 24 formed in the other places were. In this instance, it was observed that the negative-glow overlaps 26 distorted the sheath 25 so as to narrow down the sheath width between the oppositely facing surfaces.

Example No. 3

Except that the flat plate-shaped substrates 22 were made of aluminum alloy 2017 in a size of 22 mm×39 mm×3 mm, and that the film-forming temperature was changed to 500° C., an amorphous carbon film was formed on a surface of the flat plate-shaped substrates 22 in the same manner as Example No. 1. Note that 2.5-hour film-forming produced a 22 μm-film thickness amorphous carbon film on a surface of the flat plate-shaped substrates 22.

In addition, amorphous-carbon coated members provided with the amorphous carbon film produced in Example No. 3 were labeled No. 3.

Figure 3:
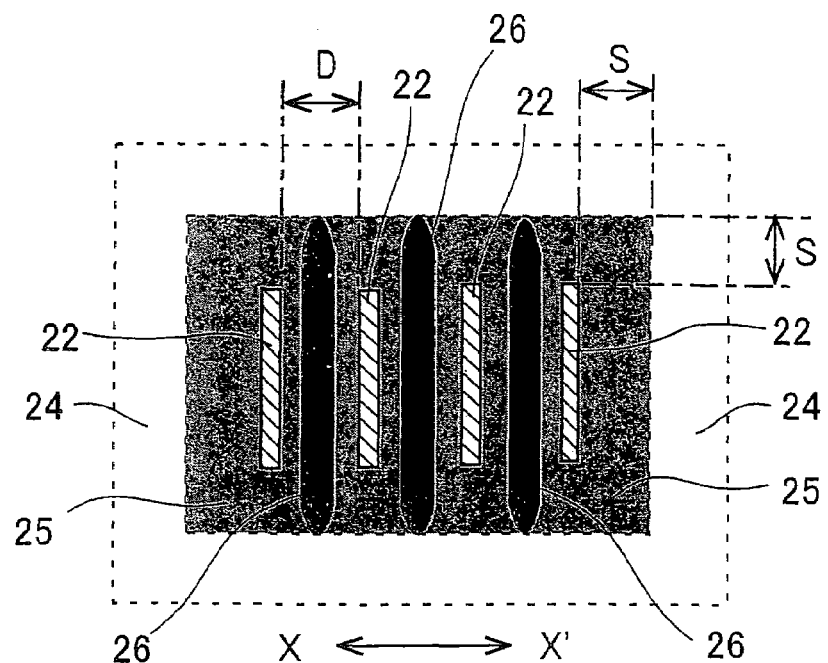
FIG. 3 is a diagram for schematically showing how a glow discharge appeared during forming films in Example No. 3, and is a cross-sectional view taken along the alternate long and one dash line "X"-"X'" of FIG. 1.

FIG. 3 illustrates how the glow discharge appeared during film forming in Example No. 3. In Example No. 3, a sheath 25 and a negative glow 24 were formed around the negative electrode 20. On the flat plate-shaped substrates 22, there was formed the sheath 25 provided with a predetermined sheath width (or "S"=10 mm) along the flat-shaped substrates 22. Between the oppositely facing surfaces of the flat plate-shaped substrates 22, each negative glow of the oppositely facing flat plate-shaped substrates 22 overlapped to form negative-glow overlaps 26 which were brighter than negative glows 24 formed in the other places were. Parts designated at "26" were discharges which were remarkably brighter than the other parts were. In this instance, it was observed that the negative-glow overlaps 26 distorted the sheath 25 so as to narrow down the sheath width between the oppositely facing surfaces.

Comparative Example No. 1

Figure 4:
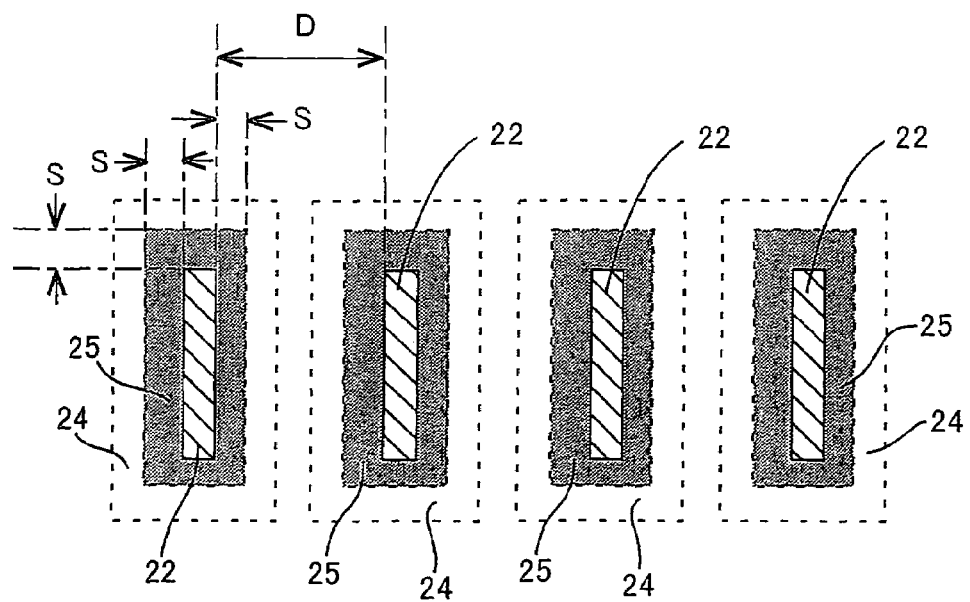
FIG. 4 is a diagram for schematically showing how a glow discharge appeared during forming films in Comparative Example Nos. 1 through 3.

In this comparative example, four pieces of 22 mm×39 mm×3 mm aluminum alloy 2017 were used as the flat plate-shaped substrates 22. As illustrated in FIG. 4, these flat plate-shaped substrates 22 were disposed one after another in a parallel manner in the thickness-wise direction simply, and were fixed to the support bench 21 in such a disposition. In this instance, the intervals "D" between the oppositely facing surfaces of the two neighboring flat plate-shaped substrates 22 were designed to be 60 mm, respectively.

Moreover, except that methane, TMS, a hydrogen gas and an argon gas were used as the mixture gas, film forming was carried out in the same manner as Example No. 1. The flow volume of the mixture gas was set to be as follows: methane: 50 sccm, TMS: 1 sccm, hydrogen gas: 30 sccm, and argon gas: 30 sccm. Note that 2-hour film forming (or a film-forming temperature of 300° C.) produced a 3 μm-film thickness amorphous carbon film on a surface of the flat plate-shaped substrates 22.

In addition, amorphous-carbon coated members provided with the amorphous carbon film produced in Comparative Example No. 1 were labeled No. 4.

Comparative Example No. 2

Except that the flat plate-shaped substrates 22 were made of stainless steel (or SUS304), an amorphous carbon film was formed on a surface of the flat plate-shaped substrates 22 in the same manner as Comparative Example No. 1. Note that 2-hour film-forming (or a film-forming temperature of 300° C.) produced a 3 μm-film thickness amorphous carbon film on a surface of the flat plate-shaped substrates 22.

In addition, amorphous-carbon coated members provided with the amorphous carbon film produced in Comparative Example No. 2 were labeled No. 5.

Comparative Example No. 3

Except that the film-forming time was changed to 4 hours, an amorphous carbon film was formed on a surface of the flat plate-shaped substrates 22 in the same manner as Comparative Example No. 1. Note that 4-hour film-forming (or a film-forming temperature of 300° C.) produced a 5 μm-film thickness amorphous carbon film on a surface of the flat plate-shaped substrates 22.

In addition, amorphous-carbon coated members provided with the amorphous carbon film produced in Comparative Example No. 3 were labeled No. 6.

Here, FIG. 4 illustrates how the glow discharge appeared during film forming in Comparative Example Nos. 1 through 3. In Comparative Example Nos. 1 through 3, sheaths 25 and negative glows 24 were formed around the negative electrode 20. On the flat plate-shaped substrates 22, there was formed the sheath 25 whose sheath width "S" was 5 mm along the flat-shaped substrates 22. The negative glows 24 formed outside the sheaths 25 did not overlap with the neighboring negative glows.

Note that, when the film-forming time is changed to 4 hours in order to thicken the film thickness in these comparative examples, no discharge-maintaining current had not flowed in the insulative amorphous carbon films so that not only the discharge became unstable but also minute arc discharges occurred. As a result, film damages or breakage resulting from the arc discharges occurred in the amorphous carbon films.

Example No. 4

Figure 6:
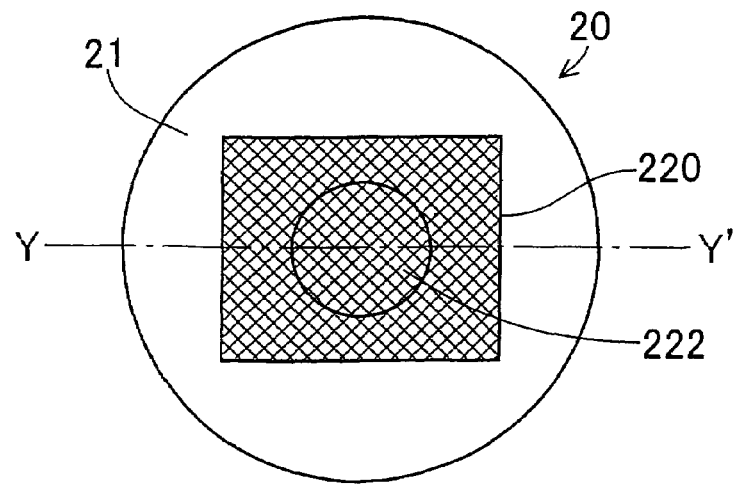
FIG. 6 is a plan view for showing how the substrate was disposed in Example No. 4 when viewed from the top of FIG. 5.
Figure 7:
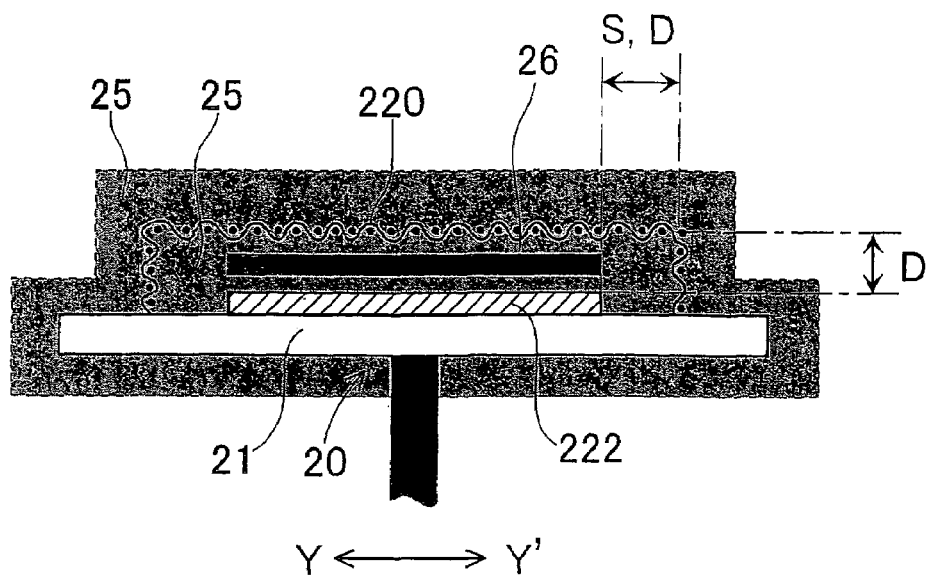
FIG. 7 is a diagram for schematically showing how a glow discharge appeared during forming a film in Example No. 4, and is a cross-sectional view taken along the alternate long and one dash line "Y"-"Y'" of FIG. 6.

An amorphous carbon film according to Example No. 4 will be described using FIG. 5 through FIG. 7. Note that FIG. 6 is a plan view for showing how a substrate was disposed in FIG. 5 when viewed from the top thereof. Moreover, FIG. 7 is a diagram for schematically showing how a glow discharge appeared during forming films in this example, and is a cross-sectional view taken along the alternate long and one dash line "Y"-"Y'" of FIG. 6.

In this example, a substrate 222 comprising a silicon wafer which had φ 4 inch and 525 μm-thickness and exhibited 100 Ω·cm, and a stainless-steel mesh 220 whose wire diameter was 0.45 mm and wire intervals were 1.7 mm was used as the flat plate-shaped substrate 22. The substrate 222 was placed on the support bench 21. The mesh 220 is disposed above the substrate 222. The opposite ends of the mesh 220 were bent so as to surround the substrate 222. The interval "D" between the a surface of the substrate 222 and a surface of the mesh 220 was designed to be 10 mm.

Next, an amorphous carbon film was formed in the same procedure as Example No. 1. FIG. 7 illustrates how a glow discharge appeared in this instance. In this example, a sheath 25 was formed around the negative electrode 20. On the substrate 222, there was formed the sheath 25 whose sheath width "S" was 5 mm along the outer surfaces of the substrate 222. Moreover, on the mesh 220, there was formed the sheath 25 whose sheath width "S" was 5 mm along the stainless-steel wires making the meshes. Therefore, negative glows overlapped in the lattice-shaped spaces of the mesh 220. In addition, the sheaths 25 approached between the substrate 222 and the mesh 220 to form a negative-glow overlap 26. Note that 2-hour film forming (or a film-forming temperature of 300° C.) produced a 4 μm-film thickness amorphous carbon film on a surface of the substrate 222.

In addition, an amorphous-carbon coated member provided with the amorphous carbon film produced in Example No. 4 was labeled No. 7.

Example No. 5

Except that methane was used as the raw material gas and a hydrogen gas was used as the diluent gas, film forming was carried out in the same manner as Example No. 1. Moreover, except that the flow volume of the mixture gas was set to be as follows: methane: 50 sccm, and hydrogen gas: 60 sccm; and except that the processing gas pressure was changed to 300 Pa, an amorphous carbon film was formed on a surface of the flat plate-shaped substrates 22 in the same manner as Example No. 1. Note that 6-hour film forming produced a 8 μm-film thickness amorphous carbon film on a surface of the flat plate-shaped substrates 22.

In addition, amorphous-carbon coated members provided with the amorphous carbon film produced in Example No. 5 were labeled No. 8.

FIG. 2 illustrates how the glow discharge appeared in Example No. 5. In Example No. 5, a sheath 25 was formed around the negative electrode 20. On the flat plate-shaped substrates 22, there was formed the sheath 25 provided with a predetermined sheath width (or "S"=5 mm) along the flat-shaped substrates 22. Between the oppositely facing surfaces of the flat plate-shaped substrates 22, negative-glow overlaps 26 were formed.

Evaluation

The amorphous-carbon coated members of No. 1 through No. 8 were subjected to the measurements of the hydrogen and silicon contents in the amorphous carbon films, the elastic modulus, the Vickers hardness and the defective surface rate. The hydrogen contents was measured by an elastic recoil detection analysis (ERDA); and the silicon content was measured with an EPMA (i.e., electron prove microanalyser). The elastic modulus and Vickers hardness were determined by tests using a nano-indenter. The defective surface ratio was determined by measuring the surface ratio of pin hole-shaped defects of the amorphous carbon films which penetrated down to the substrates by means of a critical passive-state electric-current-density method (i.e., CPCD), one of electrochemical measurement methods. Table 1 sets forth the measurement results. In Table 1, only the hydrogen and silicon contents are specified as the compositions of the amorphous carbon films. The other composition was the carbon content. For example, the composition of the amorphous carbon film of No. 1 was 51 atomic %-carbon, 38 atomic %-hydrogen, and 11 atomic %-silicon.

TABLE 1

| Member No. | Film Thickness [µm] | Hydrogen Content [atomic %] | Silicon Content [atomic %] | Elastic Modulus [GPa] | Vickers Hardness [Hv] | Defective Surface Ratio |
|---|---|---|---|---|---|---|
| No. 1 | 12 | 38 | 11 | 84 | 880 | — |
| No. 2 | 16 | 40 | 10 | 62 | 720 | $10^{-6}$ |
| No. 3 | 22 | 50 | 8 | 50 | 600 | — |
| No. 4 | 3 | 28 | 12 | 190 | 2000 | — |
| No. 5 | 3 | 26 | 12 | 190 | 2000 | $10^{-3}$ |
| No. 6 | 5 | 28 | 12 | 170 | 1700 | — |
| No. 7 | 4 | 35 | 11 | 100 | 1100 | — |
| No. 8 | 8 | 42 | 0 | 62 | 670 | — |

Figure 8:
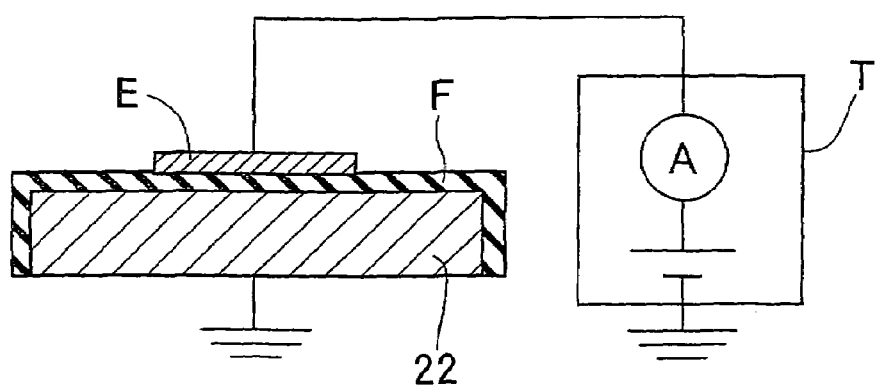
FIG. 8 is a diagram for roughly illustrating an apparatus for measuring an insulative characteristic.
Figure 9:
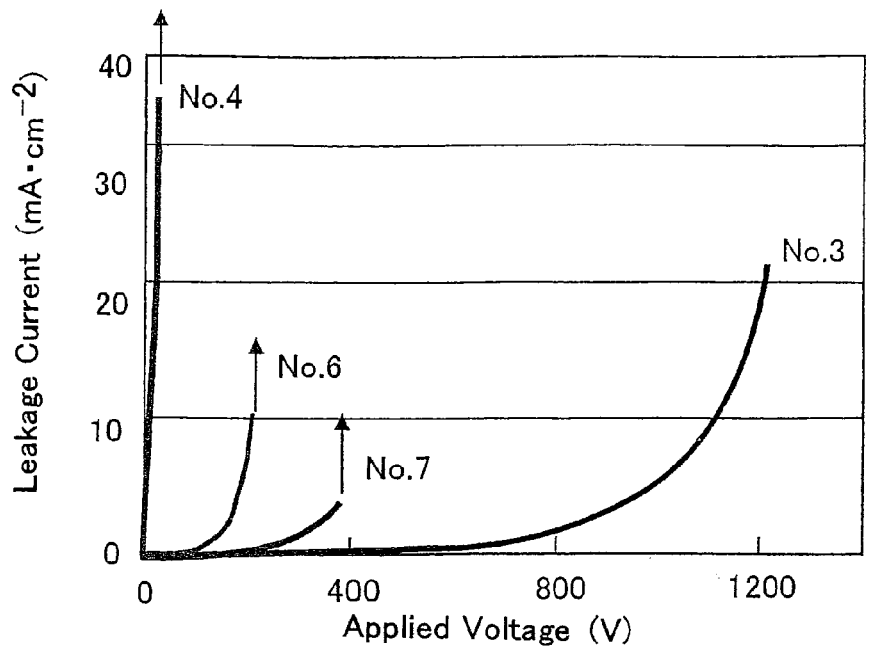
FIG. 9 is a graph for showing insulative characteristics, and showing the change of leakage currents with respect to applied voltages.

Moreover, Nos. 3, 4, 6 and 7 were examined for the insulative characteristic. The insulative characteristic was evaluated in the following manner: direct-current voltages were applied to the amorphous carbon films in the thickness-wise direction; and a leakage current was detected to determine a dielectric-breakdown withstand voltage. FIG. 8 is a schematic diagram of the measuring device. On a surface of an amorphous carbon film "F," a φ 6 mm electrode "E" was formed using a conductive paste. The electrode "E" applies direct-current voltages, and a curve tracer "T" detects a leakage current. Note that, since the amorphous-carbon coated members of Nos. 3, 4 and 6 were provided with amorphous carbon films formed on the both opposite surfaces of the substrates, they were subjected to the measurement after grounding one of the opposite surfaces to remove the amorphous carbon films. FIG. 9 illustrates the measurement results.

In Example Nos. 1 through 5, negative-glow overlaps 26 were formed in the glow discharge during film forming. Accordingly, the amorphous carbon films did not come off, and were formed at fast rates. Moreover, the amorphous carbon films of Nos. 1 through 3, No. 7 and No. 8 were soft films whose elastic modulus was 150 GPa or less and Vickers hardness was 1,500 Hv or less. In addition, the amorphous-carbon coated member of No. 2 comprised a fine-textured film whose defective surface ratio was $10^{-6}$. Moreover, the $Csp^3$ contents in the amorphous carbon films of No. 1 and No. 4 were measured using NMR. As a result, the $Csp^3$ content was 36 atomic % in No. 1, and was 28 atomic % in No. 4. The amorphous carbon film of No. 1 comprised a larger amount of hydrogen than the amorphous carbon film of No. 4 did, and its $Csp^3$ proportion was greater than that of No. 4. Consequently, the amorphous carbon film of No. 1 was a soft film whose elastic modulus was low and Vickers hardness was small.

In addition, dielectric breakdown occurred in Comparative Example Nos. 1 and 3: the dielectric-breakdown withstand voltage was 25 V for No. 4, and 200 V for No. 6, however, no dielectric breakdown took place in Example No. 3 (or No. 3) even when a high voltage of 1,200 V was applied thereto. Moreover, even in the amorphous-carbon coated member of No. 7 (or Example No. 4) whose film thickness was 4 µm, an improvement was appreciated on the insulative characteristic, compared with that of No. 6 (or Comparative Example No. 3) whose film thickness was 5 µm (see FIG. 9 so far).

Comparative Example No. 4

In Example No. 1, the processing gas pressure was changed to 10 Pa to carry out film forming. In this instance, the film-forming time was set for 3 hours. Table 2 sets forth the sheath width and the film thickness of the amorphous carbon film. In addition, amorphous-carbon coated members provided with the amorphous carbon film produced in Comparative Example No. 4 were labeled No. 9.

In this comparative example as well, a sheath was formed along the flat plate-shaped substrates 22. However, as set forth in Table 2, since the sheath width (e.g., 15 mm) was more than the intervals (e.g., 10 mm) between the oppositely facing surfaces of the flat plate-shaped substrates 22, no negative glow was formed between the oppositely facing surfaces of the flat plate-shaped substrates 22. Accordingly, the film thickness was 0.5 µm or less.

Example No. 6

In Example No. 1, the processing gas pressure was changed to 133, 266, 400 and 533 Pa to carry out film forming. In this instance, the film-forming time was set for 3 hours. Table 2 below sets forth the sheath width and the film thickness of amorphous carbon films for each of the processing as pressure. In addition, amorphous-carbon coated members provided with the amorphous carbon films produced in Example No. 6 were labeled Nos. 10 through 13, respectively.

In Example No. 6, negative-glow overlaps were formed in the glow discharge during film forming. Accordingly, the amorphous carbon films did not come off, and were formed at fast rates. Moreover, the amorphous carbon films of Nos. 10 through 13 were soft films whose elastic modulus was 150 GPa or less and which comprised hydrogen in an amount from more than 30 atomic % to 60 atomic % or less and silicon in an amount of from 10 or more to 13 atomic % or less.

Note that, in this example, 6-hour film forming with 133 Pa processing gas pressure produced a 50 µm-film thickness amorphous carbon film. This amorphous carbon film comprised hydrogen in an amount of 38 atomic % and silicon in an amount of 9 atomic %, and exhibited a Young's modulus of 60 GPa and a Vickers hardness of 700 Hv.

Comparative Example No. 5

In Example No. 1, the processing gas pressure was changed to 800 Pa and 933 Pa to carry out film forming. In this instance, the film-forming time was set for 3 hours. Table 2 sets forth the sheath width at each processing gas pressure and the film thickness of each amorphous carbon film. In addition, amorphous-carbon coated members provided with the amorphous carbon films produced in Comparative Example No. 5 were labeled No. 14 and No. 15, respectively.

In Comparative Example No. 5, the neighboring negative glows did not overlap during film forming, and the resulting amorphous carbon films were hard films whose elastic modulus exceeded 150 GPa.

TABLE 2

| Member No. | No. 9 | No. 10 | No. 11 | No. 12 | No. 13 | No. 14 | No. 15 |
|---|---|---|---|---|---|---|---|
| Processing Gas Pressure [Pa] | 10 | 133 | 266 | 400 | 533 | 800 | 933 |
| Sheath Width [mm] | 15 | 8 | 5 | 4 | 2.5 | 1 | 1 |
| Film Thickness [μm] | 0.5 or less | 25 | 12 | 8 | 6 | 4.5 | — |

Example No. 7

While the flat plate-shaped substrates 22 were made of 22 mm×39 mm×3 mm aluminum alloy 2017; hexane and TMS were used as the raw material gas; and a hydrogen gas was used as the diluent gas, film forming was carried out in the same manner as Example No. 1. In this example, the flow volume of the mixture gas was set to be as follows: hexane: 20 sccm, TMS: 2 sccm, and hydrogen gas: 100 sccm; the processing gas pressure was changed to 400 Pa; and the film-forming temperature was controlled at 300° C.

In the glow discharge during film forming according to this example, as illustrated in FIG. 2, between the oppositely facing surfaces of the flat plate-shaped substrates 22, each negative glow of the oppositely facing flat plate-shaped substrates 22 overlapped to form negative-glow overlaps 26 which were brighter than negative glows 24 formed in the other places were. The overlapped negative glows stabilized the discharge, and accordingly resulted in a low-voltage and high-electric-current-density glow discharge. Here, the plasma light-emission intensities of the negative-glow overlaps 26 and the non-overlapped negative glows 24 were measured. The plasma light-emission intensities were measured using a monitor which emits plasma of wavelength falling in a range of from 200 to 960 nm, and the intensities of light emitted from hydrogen whose light-emission intensity is the intensest were compared. As a result, the plasma light-emission intensity of the negative-glow overlaps 26 was about 8 times intenser than the plasma light-emission intensity of the non-overlapped negative glows 24.

In this example, 6-hour film forming produced a 17 μm-film thickness amorphous carbon film. The resulting amorphous carbon film comprised hydrogen in an amount of about 42 atomic % and silicon in an amount of 10 atomic %, and exhibited an elastic modulus of 60 GPa and a Vickers hardness of 700 Hv. Moreover, the insulative characteristic of the resultant amorphous carbon film was examined in the same manner as described above, and was found that no dielectric breakdown took place even when a high voltage of 1,200 V was applied thereto.

On C—H Bond

Two types of amorphous carbon films whose film-forming processes and film compositions differed were evaluated for C—H bond. One of them was an amorphous carbon film (Sample No. 1) which was formed on a surface of a 100 mm×50 mm×1.5 mm substrate made of aluminum alloy 2017 in the same manner as Example No. 1. The amorphous carbon film comprised hydrogen in an amount of about 38 atomic % and silicon in an amount of 11 atomic %, and exhibited an elastic modulus of 84 GPa.

The other one of them was an amorphous carbon film (Sample No. 2) which was formed by disposing a piece of a 200 mm×100 mm×1.5 mm substrate made of aluminum alloy 2017 independently in the same film-forming apparatus. Methane and TMS were used as the raw material gas; and a hydrogen gas and an argon gas were used as the diluent gas, and the flow volume of each gas was set to be as follows: methane: 50 sccm, TMS: 1 sccm, hydrogen gas: 30 sccm, and argon gas: 30 sccm. Moreover, the processing gas pressure was changed to 370 Pa; and the film-forming temperature was controlled at 300° C. The amorphous carbon film comprised hydrogen in an amount of about 28 atomic % and silicon in an amount of 12 atomic %, and exhibited an elastic modulus of 190 GPa.

FT-IR was used to evaluate C—H bond. Both amorphous carbon films of Sample Nos. 1 and 2 were pulverized, and 0.5 g of each powder was mixed with 200 mg of a potassium bromide powder to pelletize. These were subjected to an FT-IR analysis to measure the absorbance of C—H bond in each sample. Table 3 sets forth the results.

TABLE 3

| Organic Acid (Wave Number/cm$^{-1}$) | $CH_3$ (2950) | $CH_2$ (2920): Symmetric Stretching Vibration | $CH_2$ (2850): Asymmetric Stretching Vibration |
|---|---|---|---|
| Sample No. 1 | 0.0070 | 0.011 | 0.0080 |
| Sample No. 2 | 0.0005 | 0.001 | 0.0015 |

As set forth in Table 3, the absorbances of Sample No. 1 were from 5 to 14 times or more than those of Sample No. 2. Thus, it is understood that the present amorphous carbon film whose hydrogen content is large and elastic modulus is low comprises many C—H bonds.

On Plasma Light-emission Intensity

The above-described film-forming apparatus was used to expose 22 mm×39 mm×3 mm substrates made of aluminum alloy 2017, which were placed in various disposition patters, to a discharge, and to heat them to 300° C. In this instance, plasmas generated on a surface of the substrates were examined. A plasma process monitor "C7460" produced by HAMAMATSU PHOTONICS Co. Ltd. was used to examine the plasmas. The examination conditions were set to be as follows: examined wavelengths: from 200 to 950 nm, examined area: φ 3 mm, exposure time: 0.1 second, and accumulated times: 10 times. Moreover, an integrated value of light over wavelengths of from 200 to 960 nm was defined as a plasma light-emission intensity.

Figure 10:
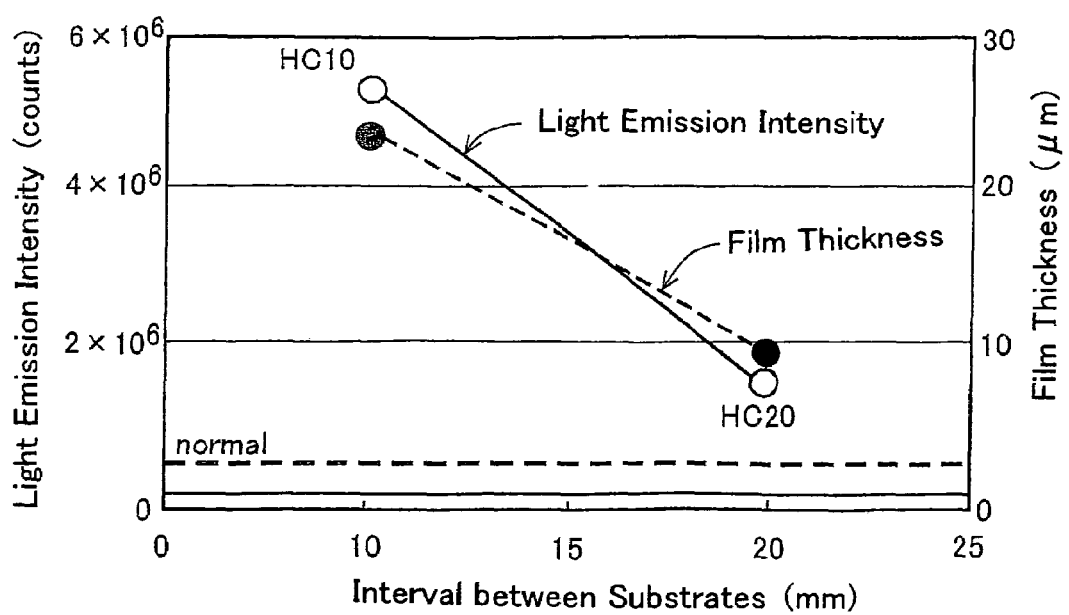
FIG. 10 is a graph for showing the relationships between intervals between substrates and plasma light-emission intensities and film thicknesses.

Moreover, amorphous carbon films were developed on a surface of the substrates, which were placed in the same disposition patters, while supplying methane, TMS and a hydrogen gas in predetermined flow volumes. The film-forming temperature was 300° C., the processing gas pressure was 370 Pa, and the film-forming time was 3 hours. FIG. 10 illustrates the plasma light-emission intensity in each disposition pattern and the film thickness of each formed amorphous carbon film. In FIG. 10, "HC10" designates a case where two pieces of the substrates were disposed to-oppositely face at an interval of 10 mm; "HC20" designates a case where two pieces of the substrates were disposed to oppositely face at an interval of 20 mm; and "normal" designates a case where one piece of the substrate was disposed independently. Moreover, the blank circles specify the light emission intensities; and the solid circles specify the film thicknesses.

As illustrated in FIG. 10, the plasma light-emission intensities designated at "HC10" and "HC20" were 20 times or more and 7 times or more intenser than the plasma light-emission intensity designated at "normal," respectively. Thus, when a plurality of substrates are disposed to oppositely face at predetermined intervals, the negative glows of the respective substrates overlap with each other so that it is possible to produce high-current-density discharges. Moreover, the film thickness designated at "normal" was 3.0 μm, whereas the film thickness designated at "HC10" was 24.2 μm and the film thickness designated at "HC20" was 9.3 μm. That is, the intenser the light-emission intensity was, the faster the film-forming rate was and the thicker the film thickness was.

What is claimed is:

1. Amorphous carbon, comprising: carbon as a major component; and hydrogen in an amount of from more than 30 atomic % to 60 atomic % or less; and exhibiting an elastic modulus of from 40 or more to 84 GPa or less.

2. The amorphous carbon set forth in claim 1, wherein when an entire content of the carbon is taken as 100 atomic %, a content of carbon having an $sp^3$ hybrid orbital falls in a range of from 10 atomic % or more to 85 atomic % or less.

3. The amorphous carbon set forth in claim 1 exhibiting a Vickers hardness falling in a range of from 400 or more to 1,500 Hv or less.

4. The amorphous carbon set forth in claim 1 comprising silicon in an amount of 50 atomic % or less when, the entirety is taken as 100 atomic %.

5. The amorphous carbon set forth in claim 1 exhibiting an elastic modulus of from 60 GPa or more to 84 GPa or less.

6. The amorphous carbon set forth in claim 1, wherein a content of carbon having an $sp^3$ hybrid orbital falls in a range of from 20 atomic % or more to 50 atomic % or less.

7. The amorphous carbon set forth in claim 1, wherein a content of hydrogen falls in a range of from 35 atomic % or more to 50 atomic % or less.

8. The amorphous carbon set forth in claim 1, wherein a content of silicon is 30 atomic % or less.

9. The amorphous carbon set forth in claim 1, wherein a content of silicon is 50 atomic % or less.

10. The amorphous carbon set forth in claim 1, wherein a content of silicon is 3 atomic % or more.

11. The amorphous carbon set forth in claim 1, wherein a content of silicon is 5 atomic % or more.

12. The amorphous carbon set forth in claim 1 exhibiting a Vickers hardness falling in a range of from 700 Hv or more to 1200 Hv or less.

* * * * *